United States Patent [19]
Osterwalder

[11] Patent Number: 5,384,799
[45] Date of Patent: Jan. 24, 1995

[54] FREQUENCY STABILIZED LASER WITH ELECTRONIC TUNABLE EXTERNAL CAVITY

[75] Inventor: Johann M. Osterwalder, Encinitas, Calif.

[73] Assignee: Martin Marietta Corporation, San Diego, Calif.

[21] Appl. No.: 118,908

[22] Filed: Sep. 9, 1993

[51] Int. Cl.$^6$ ............................................. H01S 3/13
[52] U.S. Cl. ........................................ 372/32; 372/64; 372/13; 372/20; 372/21; 372/97; 372/26
[58] Field of Search ...................... 372/29–32, 372/97, 64, 12, 13, 20, 21, 102, 26

[56] References Cited

U.S. PATENT DOCUMENTS

| | | | |
|---|---|---|---|
| 4,905,253 | 2/1990 | Chraplyvy et al. | 372/96 |
| 4,908,833 | 3/1990 | Chraplyvy et al. | 372/96 |
| 5,020,153 | 5/1991 | Choa et al. | 372/96 |
| 5,132,976 | 7/1992 | Chong et al. | 372/20 |
| 5,140,599 | 8/1992 | Trutna, Jr. et al. | 372/20 |
| 5,181,210 | 1/1993 | Chung et al. | 372/20 |

*Primary Examiner*—Léon Scott, Jr.
*Attorney, Agent, or Firm*—John R. Duncan; Frank D. Gilliam

[57] ABSTRACT

Method and arrangement for locking a laser to an external cavity that is electronically tunable to provide an optical source that is highly coherent and which is frequency stabilized over a variable frequency range. Preferably, an injection laser is tightly coupled to an external acousto-optic cavity having a reflective mirror on its back facet and carried on an electro-optic crystal substrate. A transducer is coupled to the external cavity and converts an electrical sinusoidal input signal into an acoustic wave which travels along the electro-optic crystal substrate to modulate the refractive index of the material along the optical waveguide. The periodicity of the refractive index along the waveguide is accordingly determined to be equal to one half wavelength of the acoustic frequency propagating in the waveguide which locks the laser at a particular optical frequency determined by the refractive index profile. The arrangement is particularly desirable for frequency division multiplexing applications.

18 Claims, 1 Drawing Sheet

FREQUENCY STABILIZED LASER WITH ELECTRONIC TUNABLE EXTERNAL CAVITY

FIELD OF THE INVENTION

This invention relates to an improvement in the field of lasers and more particularly, but not by way of limitation, to a laser having an external cavity that is electronically tunable, preferably by an electro-acoustic means, to provide an optical source that is highly coherent and which is frequency stabilized.

BACKGROUND OF THE INVENTION

Many different types of lasers have been developed in recent years. These different types of lasers have many different characteristics and each are suitable for particular special applications. Many of the lasers because of their peculiar characteristics are more adaptable to certain applications than others.

Certain applications such as communications, require the ability to modulate the laser. The modulation may be either amplitude modulation (AM) or frequency modulation (FM). Frequency modulation of the carrier wave is preferred in communication systems because of its better signal to noise ratio as compared to amplitude modulation.

Injection lasers are one type of laser that is suitable for communication and other similar systems. These lasers are typically modulated by a modulation of the laser's bias current. U.S. Pat. No. 4,485,474 illustrates a laser provided with a closely coupled external tunable resonator for high frequency modulation of the laser's modes. The resonator includes a crystal and a bias contact secured to the top of the crystal resonator and to a source of bias voltage or modulating voltage. The bias voltage or modulating voltage on the crystal modifies the optical properties (changes the index of refraction) of the crystal and thereby provides a tunable but low Q (low coherence) resonator system allowing a multiplicity of laser frequencies.

U.S. Pat. No. 4,101,845 discloses a method for producing coherent mode pure radiation modulated at a high bit rate, having two optically coupled injection lasers which may be independently controlled. A direct current is passed through a first injection laser having good optical quality and good spectral purity of its initial radiation, the direct current being such that said first injection laser is biased above the threshold value, and biasing a further injection laser having a low optical quality in comparison to the first injection laser, by a direct current passing through it and controlling said further injection laser additionally by a modulation current superimposed on this direct current.

It is also well known that the performance of short cavity lasers such as injection lasers can be improved by the addition of passive cavity or grating structures. Such devices may be added externally or integrated with the laser on the same substrate. For example, see LASER FOCUS/ELECTRO-OPTICS of October, 1988, page 112 which describes distributed feedback diode lasers with single-longitudinal mode output that include an external cavity defined by a fiber coupled to the laser cavity or by an integral waveguide fabricated directly onto the laser substrate.

The purpose of such short cavity lasers is usually to narrow the laser's linewidth and to stabilize the laser output frequency. The major disadvantage of the known stabilization techniques is the nontunability of such systems. For frequency division multiplexing (FDM) applications rapid electronic tuning of the laser's frequency is necessary. Accordingly, it is believed that the shortcomings of prior systems is overcome by the arrangement and method of the present invention which provides an electronically tunable system while maintaining the advantages of a narrow source linewidth and carrier frequency stability.

SUMMARY OF THE INVENTION

It is an object of the invention to provide a method and arrangement for locking a laser source to an external cavity which is electronically tunable to provide a laser source which has a narrow linewidth (highly coherent) and that is frequency stabilized by the external cavity.

Briefly stated, the invention contemplates a laser source, such as an injection laser, that is tightly coupled to the front facet of an external cavity that is transmissive at the laser's operating wavelength and which may be an external grating formed on an acoustic-optic crystal, such as lithium niobate A mirror is provided on a back facet of the cavity so that light reflected by the mirror interferes in the laser with its internal radiation and dependent on the wavelength and return path-length enhances some frequencies and attenuates other frequencies to obtain a number of discrete preferred laser frequency oscillations.

To limit the number of possible laser oscillations to a single frequency a periodic structure is introduced into the external cavity. The periodicity of the external cavity is chosen to be one half wavelength of the desired laser frequency propagating in said cavity. Thus, only one frequency component will survive in the cavity and the laser frequency will be locked to that specific grating frequency.

A periodic refractive index variation is introduced in the external cavity by a transducer coupled to the back facet of the lithium niobate crystal that converts an electrical sinusoidal input signal into an acoustic wave which travels along the lithium niobate substrate and modulates thereby the refractive index of the crystal along the optical waveguide. Since the frequency of the acoustic wave can be varied, the waveguide periodicity can be varied and the desired laser locking frequency can be electronically tuned with great accuracy since synthesized stable acoustic frequency sources in the GHz range are available. The invention is particularly desirable for frequency division multiplexing applications.

The foregoing has outlined rather broadly the more pertinent and important features of the present invention in order that the detailed description of the invention that follows may be better understood so that the present contribution to the art may be more fully appreciated. Additional features of the invention will be described hereinafter which form the subject of the claims of the invention. It should be appreciated by those skilled in the art that the conception and the disclosed specific embodiment may be readily utilized as a basis for modifying or designing other arrangements and methods for carrying out the same purposes of the present invention. It should also be realized by those skilled in the art that such equivalent constructions and methods do not depart from the spirit and scope of the invention as set forth in the appended claims.

BRIEF DESCRIPTION OF THE DRAWING

For a fuller understanding of the nature and objects of the invention, reference should be had to the following detailed description taken in conjunction with the accompanying drawing in which.

DETAILED DESCRIPTION OF THE INVENTION

Figure 1:
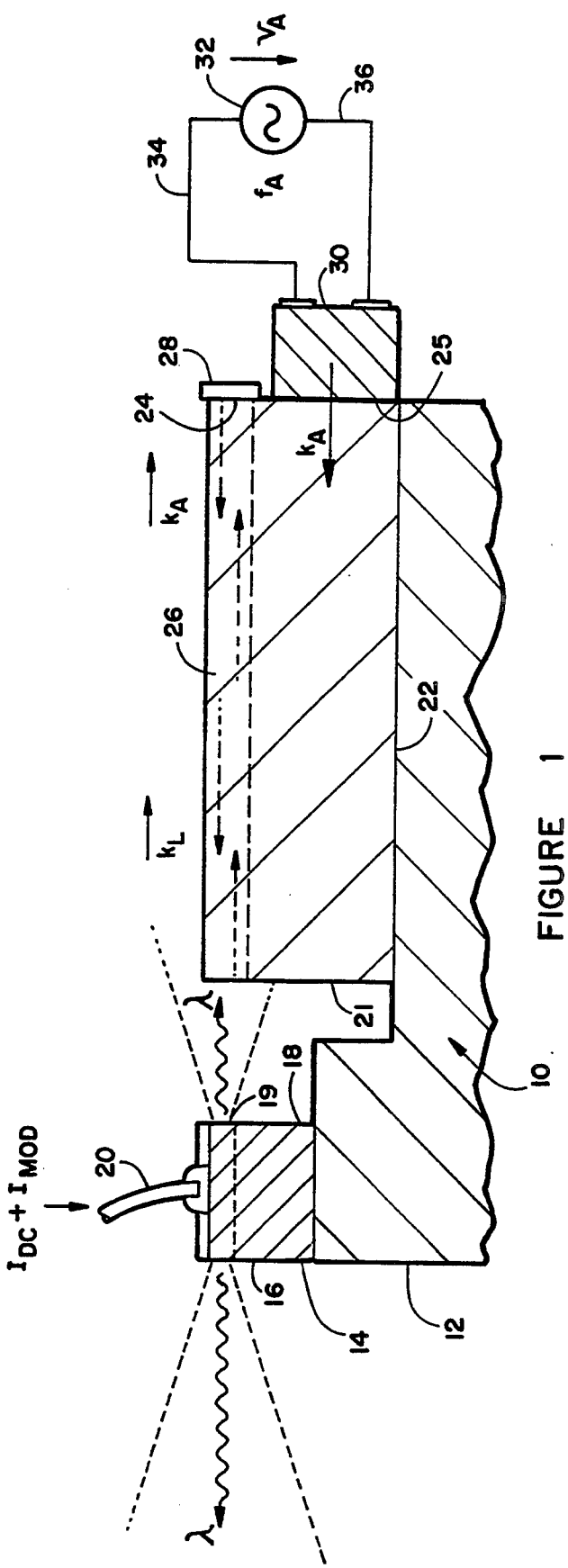
FIG. 1 is an arrangement constructed in accordance with a preferred embodiment of the present invention.

Referring now to the drawing in detail, and in particular to FIG. 1, reference character 10 generally designates an arrangement constructed in accordance with a preferred embodiment of the invention. The arrangement 10 includes a baseplate 12 which acts a suitable heat sink and on which is directly mounted an injection laser chip 14. The laser chip 14 is preferably of the type such as GaAs, GaAlAs, and GaAsP. These materials provide a spectral output in the range of 0.61 to 1.6 micrometer. The materials also have the ability to be lased at room temperature without requiring cooling.

The laser chip is prepared in the usual manner having a front facet 16 and a rear facet 18 and a laser light channel 19 extending the length thereof. A lead 20 is connected to the upper surface of the laser chip 14 for applying a bias current from a suitable direct current source and for applying a modulating current to the chip 14.

A typical embodiment of the laser chip 14 is on the order of approximately 0.3 millimeters in length and is spaced approximately 0.5 millimeters from the face 21 of a lithium niobate crystal 22 having a rear face 24. The injection laser chip 14 in the arrangement of the present invention is considered to be closely coupled to the crystal 22. The crystal 22 is provided with an external optical cavity waveguide 26 which in the preferred embodiment is a grating. The optical waveguide 26 is provided on its rear facet with a suitable mirror 28.

The external optical cavity 26 is in close proximity to the rear facet 18 of the injection laser chip 14 and is transmissive at the laser's operating wavelength. The light from the injection laser chip 14 passes through the optical cavity 26 and is reflected back from the mirror 28. The light reflected by the mirror 28 interferes in the laser 14 with its internal radiation and dependent on the wavelength and return pathlength some frequencies are enhanced and others attenuated which results in a number of discrete preferred laser frequency oscillations. This number is usually large and the frequency spacing between the oscillating modes is given $f=c/2nl$ by where l is the path length between the laser back facet 16 and far end 24 of the external laser cavity 26. The refractive index of the cavity material is given by n and c is a constant.

In order to limit the number of possible laser oscillations to a single frequency, the arrangement of the present invention introduces a periodic structure into the external cavity 26. The periodicity of the grating 26 is required to be equal to one half wavelength of the desired laser frequency propagating in the grating structure 26. Only one frequency component will now survive in the grating structure 26 and the laser frequency will be locked to that specific grating frequency if the coupling of the laser 14 and the external cavity 26 is tight enough. While such a fixed grating structure has been built and a laser locked to it as shown in the cited LASER FOCUS/ELECTRO-OPTICS publication, the present invention illustrates a method for providing an electronically tunable locked laser source.

Figure 2:
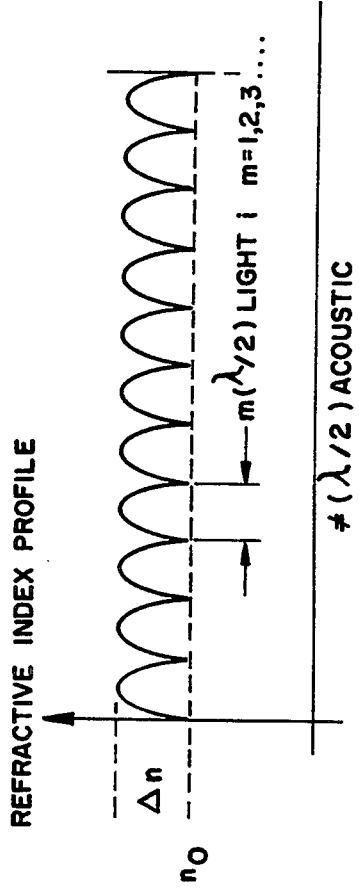
FIG. 2 is a graphic illustration of the refractive index profile of the invention.

The invention creates a periodic refractive index variation in the external cavity 26 provided on the electro-acoustic material of the lithium niobate 22 by means of an acoustic beam. A suitable acousto-optic transducer 30 is secured to the rear face 24 of the lithium niobate substrate 22. A suitable variable frequency generator 32 is connected to the transducer 30 by suitable leads 34 and 36. The frequency generator 34 generates a variable frequency electrical sinusoidal input signal in the GHz range which is applied to the transducer 30. The transducer converts the input electrical signal into an acoustic wave which travels along the lithium niobate substrate and modulates thereby the refractive index of the material along the optical waveguide 26 as seen in FIG. 2. It is important that the propagation vector of the acoustic wave $K_A$ is parallel to the light propagation vector $K_L$ to obtain the desired effect. The acoustic propagation velocity is slower by approximately a factor of $10^5$ than the light velocity. Using acoustic frequencies in the low GHz range will create a grating periodicity which is one half wavelength for visible or near infrared (IR) light beams. Since the acoustic frequency applied to the crystal 22 can be varied, the periodicity of the grating or external cavity 26 can be varied and the desired laser locking frequency can be electronically tuned with great accuracy since synthesized stable frequency sources, such as generator 32, in the GHz are available.

It is also important that the acoustic wave traveling along the z-direction of the optical waveguide 26 is reflected at the end face 24 of the crystal since an acoustic standing wave pattern must be formed in order to create a periodic refractive index variation. A refractive index profile is illustrated in FIG. 2 for the arrangement of FIG. 1.

While the novel invention has been described in connection with its application to a electronically tunable external grating on an electro-optic crystal for locking a laser source and thereby providing an optical source which has a narrow linewidth and which is frequency stabilized by the grating, it is understood that the invention may be employed to advantage in other systems that are applicable to other laser systems without deviating from the principles and broad scope thereof. For example, the arrangement shown in FIG. 1 makes use of a lithium niobate substrate which is know to be acousto-optic but other materials may be used. Thus, a piece of cleaved optical fiber may be used as an external cavity with an acoustic transducer attached to one end. Other electronic effects may be employed to produce a refractive index variation along the optical waveguide to provide a tunable laser source that can be modulated with large bandwidth signals without loss of the source coherency and frequency stabilization. Such tunable laser sources are highly desirable for frequency division multiplexing applications.

I claim:

1. A light source for producing light having a narrow linewidth and which is frequency stabilized comprising:

a laser providing a first light output;

bias current input means coupled to the laser;

external cavity means closely coupled to the laser;

a transducer coupled to said cavity means to introduce a variable acoustic wave into said cavity to electronically tune a laser locking frequency and to lock the frequency of said light output to a predetermined value having a narrow linewidth.

2. The arrangement defined in claim 1 wherein the cavity means is an optical waveguide device that is located adjacent to and optically coupled to the laser.

3. The arrangement defined in claim 1 wherein the optical cavity includes an acousto-optic crystal having a grating that is transmissive at the laser's operating wavelength.

4. The arrangement defined in claim 3 wherein the cavity means further includes a mirror secured to a face of the acousto-optical waveguide separated from the face coupling the acousto-optic crystal to the laser so that the light reflected by the mirror interferes in the laser with its internal radiation and dependent on the wavelength and return path length enhances some frequencies and attenuates other frequencies to provide a number of discrete preferred oscillations.

5. The arrangement of claim 4 wherein the acousto-optic crystal is tunable to a preferred frequency by a means that produces a refractive index variation along the acousto-optic crystal by forming a predetermined acoustic standing wave pattern within said crystal so that the laser is locked to the preferred frequency.

6. The arrangement of claim 4 wherein the refractive index variation means comprises an electro-acoustic means that is coupled to the acousto-optic crystal for generating an acoustic wave which travels along the acousto-optic crystal for generating an acoustic wave which travels along the acousto-optic crystal and modulates thereby the refractive index of the acousto-optic crystal.

7. The arrangement defined in claim 6 wherein the electro-acoustic means generates an acoustic wave having a propagation vector that is parallel to the light propagation vector of light received from the laser.

8. The arrangement defined in claim 7 wherein the electro-acoustic means has opposing parallel end faces, one end face receiving light from the laser and the other end face having a mirror secured to it to reflect the light from the laser and also having secured to it an acoustic transducer.

9. The arrangement defined in claim 8 wherein the electro-acoustic means includes a variable electronic means that generates an electrical sinusoidal input signal which is applied to the acoustic transducer secured to the other end face which converts said electrical signal into an acoustic wave.

10. The arrangement as defined in claim 9 wherein the acousto-optic crystal is a lithium niobate crystal having an external grating provided on a surface parallel to the light received from laser to provide an optical waveguide whereby the acoustic wave travels along the lithium niobate crystal and modulates thereby the refractive index of the crystal along the optical waveguide to limit the number of possible laser oscillations to a single frequency.

11. The arrangement as defined in claim 10 wherein the laser comprises an injection laser.

12. The arrangement as defined in claim 11 wherein the injection laser includes a rear facet that is tightly coupled to a face of the lithium crystal and the fixed external grating providing an optical waveguide.

13. The arrangement as defined in claim 12 wherein the input means coupled to the laser includes a lead coupled to the injection laser and means for applying to it a bias current and a modulating current whereby the rapid electronic tuning to the laser's frequency by the acousto-optic crystal to a stable carrier frequency is useful for frequency division multiplexing application.

14. A method of producing highly coherent optic radiation having a very stable frequency for frequency division multiplexing applications, comprising:
modulating an electric current;
applying said electrical current to an injection laser to cause it to emit optical radiation;
directing said optical radiation to an external optic cavity so that said optical radiation is reflected by a back facet of the cavity back to said laser to interfere in the laser with laser internal radiation and enhance some frequencies and to attenuate other frequencies, and
generating a variable frequency electrical sinusoidal input signal;
transducing said input signal into a corresponding acoustic wave;
directing said acoustic wave into the cavity for varying the refractive index of the external cavity;
thereby to produce a periodicity of the external optic cavity that is one half wavelength of the frequency propagating in the cavity so that only one frequency component will exit the optic cavity.

15. The method defined in claim 14 wherein the step of varying the refractive index of the external optic waveguide is performed by applying a predetermined acoustic wave to the optic waveguide for selection of the one frequency component that will survive in the optic waveguide.

16. An arrangement for producing highly coherent optic radiation having a very stable frequency for frequency division multiplexing applications comprising in combination:
an injection laser having front and back facets and providing coherent mode radiation;
means for applying a direct current bias to the laser and superimposing a modulation current on the direct current; an external acousto-optic cavity that is tightly coupled to the rear facet of the laser and which is transmissive at the laser's operating wavelength;
a reflective surface secured to a face of the external cavity spaced from the rear facet of the laser and arranged to reflect light that interferes in the laser with its internal radiation and dependent on the wavelength and return path length enhances some frequencies and attenuates others to provide a plurality of discrete preferred frequency oscillations, and
a variable frequency generator driven transducer means coupled to the external cavity to produce a periodic refractive index variation in the external cavity to variably select a desired laser locking frequency whereby the laser provides highly coherent mode radiation that is frequency stabilized.

17. The arrangement as defined in claim 16 wherein said traducer means includes a transducer coupled to a back face of the external cavity for converting an electrical sinusoidal input signal into an acoustic wave having a propagation vector parallel to the laser light propagation vector to create periodicity within the external cavity equal to one half of the desired laser frequency propagating in the external cavity so that only one frequency component will survive in said cavity and the frequency of the laser output is locked to that specific frequency.

18. The arrangement as defined in claim 17 wherein the external cavity is lithium niobate.

* * * * *